Aug. 10, 1965 M. F. RITCHEY 3,200,351
PULSE TRAIN PRODUCING APPARATUS
Filed July 3, 1961 2 Sheets-Sheet 1
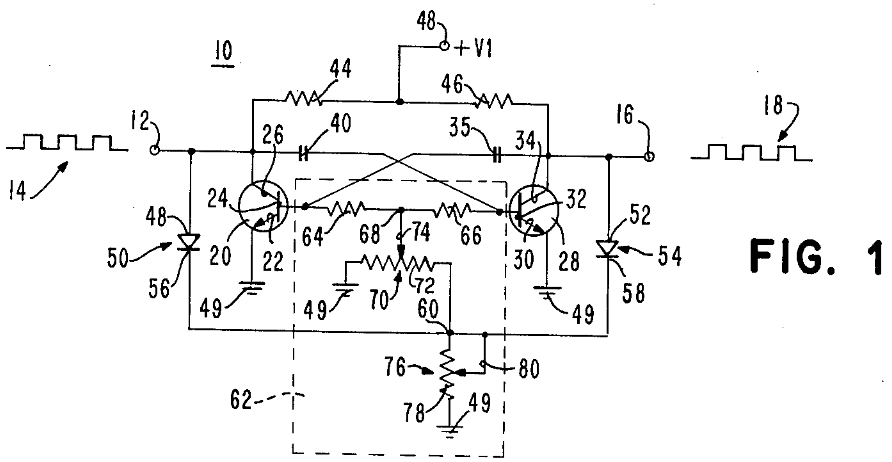
FIG. 2
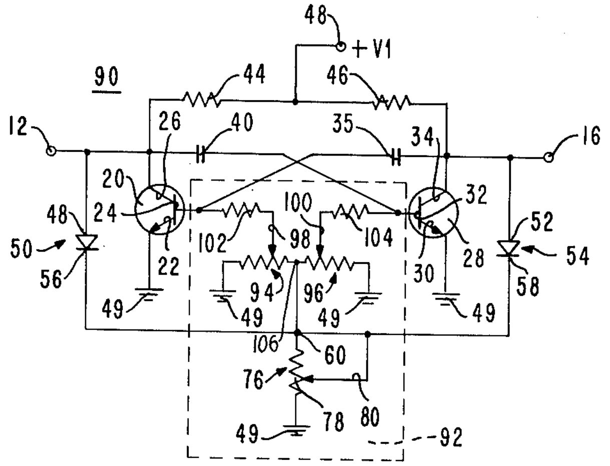
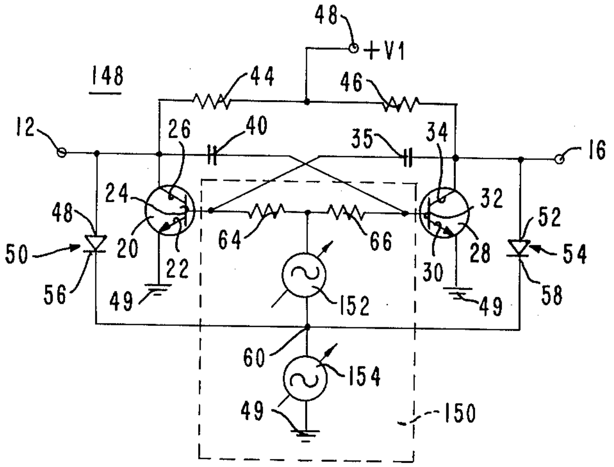
FIG. 3
INVENTOR
MELVIN F. RITCHEY
BY Bernard N. Wiener
ATTORNEY United States Patent Office 3,200,351
Patented Aug. 10, 1965

3,200,351

PULSE TRAIN PRODUCING APPARATUS

Melvin F. Ritchey, Columbus, Miss., assignor to International Business Machines Corporation, New York, N.Y., a corporation of New York Filed July 3, 1961, Ser. No. 121,617
4 Claims. (Cl. 332—14)

This invention relates to pulse train producing apparatus and more particularly to an astable multivibrator with amplitude and timing controls for the output pulse train therefrom.

A multivibrator is an electronic device having two operative sections each of which is alternately in a first or second current conduction condition. It provides a train of output pulses with particular amplitude and timing characteristics. The pulse characteristics of the pulse train from an astable multivibrator are completely controlled by internal circuit parameters. There is an output pulse produced each time an operative section passes from one current conduction condition to the other and returns thereto. It is desirable for many applications of an astable multivibrator that the amplitude and timing characteristics of the output pulse train therefrom be independently adjustable. Timing characteristics in this context include both pulse width and relative time spacing or frequency of the pulses of the output pulse train.

Heretofore, the techniques utilized for varying the amplitude characteristic of the output pulse train of an astable multivibrator have caused the timing characteristics thereof to change. An illustrative reference for a conventional astable multivibrator and nature of the pulse characteristics of the output pulse train therefrom is "Electronic Switching, Timing, and Pulse Circuits," pp. 131–142, by J. M. Pettit, McGraw-Hill Book Company, Inc., 1959.

It is a prime object of this invention to provide pulse train producing apparatus having independently adjustable pulse amplitude characteristic and pulse timing characteristic controls.

It is an important object of this invention to provide an astable multivibrator having adjustable controls for the amplitude and timing characteristics of the output pulse train therefrom.

It is another object of this invention to provide an astable multivibrator having independently adjustable amplitude and timing controls for the output pulse train therefrom.

It is a further object of this invention to provide an astable multivibrator having independently adjustable amplitude and frequency controls for the output pulse train therefrom.

It is still another object of this invention to provide an astable multivibrator having independently adjustable amplitude and pulse width controls for the output pulse train therefrom.

One further object of this invention is to provide an astable multivibrator with independently adjustable amplitude and timing modulation controls for the output pulse train therefrom.

The foregoing and other objects, features and advantages of the invention will be apparent from the following more particular description of preferred embodiments of the invention, as illustrated in the accompanying drawings.

In the drawings:

FIGURE 1 illustrates a transistorized astable multivibrator in accordance with this invention in which amplitude control of its output pulse train is obtained from the dynamic potentials of the transistor collectors by an OR circuit connected thereto and the timing control of its output pulse train is obtained by a potentiometer connected between the common junction of the OR circuit and the bases of the transistors.

FIGURE 2 illustrates an astable multivibrator in accordance with this invention, similar to the embodiment illustrated by FIG. 1, in which both the pulse width and pulse frequency of an output pulse train therefrom can be independently controlled.

FIGURE 3 illustrates an astable multivibrator in accordance with this invention with independently adjustable amplitude and timing modulation controls for the output pulse train therefrom.

Figure 4:
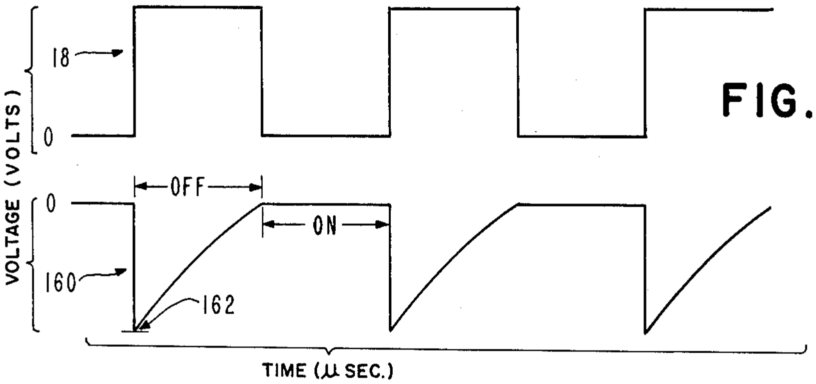
FIGURE 4 illustrates both the base and collector potentials of a transistor of an operative section of an astable multivibrator.

This invention provides pulse train producing apparatus. The amplitude and timing characteristics of the pulse train are independently adjustable. The apparatus includes two operative current conductable sections each capable of manifesting two current conduction conditions. Each operative section has a current conduction control device. The apparatus has appropriate circuitry to cause the current conditions of each section to alternate sequentially. Pulse train amplitude characteristic control is obtained through an OR circuit connected to an output terminal of each operative section in conjunction with a voltage divider. Pulse train timing characteristic control is obtained by voltage control circuitry connected between the common junction of the OR circuit and the control devices via respective relaxation-time devices.

One feature of this invention is a transistorized astable multivibrator having independently controllable output pulse train amplitude characteristic and timing characteristic controls. The amplitude characteristic control includes an OR circuit connected to the collectors to establish a common junction and a potentiometer connected thereto as part of a voltage divider. The timing characteristic control includes a potentiometer connected between the OR circuit common junction and the bases of the transistors via respective resistor-capacitor relaxation-time networks.

Another feature of this invention is a transistorized astable multivibrator in which the pulse train amplitude characteristic is adjustable through an OR circuit and a voltage divider associated with the collectors and the pulse train timing characteristics, i.e., pulse width and relative pulse time spacing, are adjustable through independently variable potentiometers connected respectively to the bases of the transistors via respective resistor-capacitor relaxation-time networks.

Still another feature of this invention is a transistorized astable multivibrator whose amplitude and timing characteristics are independently modulatable. The amplitude modulation is obtained by connecting a variable voltage source to the common junction of the OR circuit and modulation of the timing characteristics is obtained by connecting a variable voltage source between the common OR junction and the bases of the transistors via respective resistor-capacitor relaxation-time networks.

The pulse train provided by apparatus in accordance with this invention is particularly suitable for testing electrical circuitry. Since both the amplitude characteristic and timing characteristic of the pulse train are independently adjustable, the operating parameters of the electrical circuitry can be variously tested.

FIG. 1 presents a first preferred embodiment 10 of the astable multivibrator in accordance with this invention. Astable multivibrator 10 has output terminal 12 which provides pulse train 14 and output terminal 16 which provides pulse train 18. It includes transistor 20 with emitter 22, base 24 and collector 26; and transistor 28 with emitter 30, base 32 and collector 34. Transistors 20 and 28 are of the N-P-N type and the circuitry of astable multivibrator 10 is developed in accordance therewith. However, the invention can readily be practiced with P-N-P transistors by utilizing conventional techniques to vary the necessary circuit parameters. Base junction 24 of transistor 20 is connected via capacitor 35 to collector junction 34 of transistor 28; and base junction 32 of transistor 28 is connected via capacitor 40 to collector junction 26 of transistor 20. Collector junction 26 of transistor 20 is also connected via resistor 44 to voltage terminal 48; and collector junction 34 is connected via resistor 46 to voltage terminal 48. Voltage terminal 48 is connected to positive voltage source +V1. Emitters 22 and 30 of transistors 20 and 28 are connected to ground 49.

Anode 48 of diode 50 is connected to collector junction 26; and anode 52 of diode 54 is connected to collector junction 34. Cathodes 56 and 58 of diodes 50 and 54 are connected at diode terminal 60. Control network 62 completes the multivibrator 10 and provides means for independent frequency control and amplitude control therefor. Control network 62 includes resistors 64 and 66 connected at one terminal thereof to base junctions 24 and 32, respectively. They are connected together at their other terminals by junction 68. Frequency control potentiometer 70 has resistor 72 and sliding contact 74. Resistor 72 is connected at one end to ground 49 and at its other end to junction 60 between the cathodes 56 and 58 of diodes 50 and 54, respectively. Amplitude control potentiometer 76 comprises resistor 78 and sliding contact 80. Resistor 78 is connected at one end to junction 60 and at its other end to ground 49. Sliding contact 80 is connected to junction 60.

The operation of the embodiment 10 will now be considered. There are two quasi-stable current conductable operative sections in astable multivibrator 10. Each operative section has two current conduction conditions. If it is assumed for the initial condition that transistor 20 is conducting and transistor 28 is non-conducting, the charges on capacitors 40 and 35 are such as thereafter to cause transistor 28 to become conducting and transistor 20 to become non-conducting. Diodes 50 and 54 establish or clamp junction 60 at the upper dynamic potentials of collectors 26 and 34. Effectively, diodes 50 and 54 together with potentiometer 76 comprise an OR circuit whose output voltage follows the highest input voltage.

The amplitude control for the amplitude of the output pulse train 18 will be understood by considering that the sliding contact 80 of potentiometer 76 is moved from an original position closer to ground 49. The effective resistance of potentiometer 76 and collector resistors 44 and 46, respectively, form voltage dividers between voltage source +V1 and ground 49. Illustratively, potentiometer 76 and resistor 46 divide the voltage between terminal 48 and ground 49 to establish junction 60 at a potential therebetween. Since the potential of junction 60 is determined by the highest upper dynamic voltage of collector 26 or 34, the pulse amplitude is substantially identical thereto. The difference being the voltage drop across diode 54. When the slider 80 is moved nearer the ground potential 49, the effective resistance of potentiometer 76 is reduced. Therefore, a smaller portion of the voltage between terminal 48 and ground 49 appears across potentiometer 76. As it is the potential of junction 60 which determines the pulse amplitude, the latter becomes smaller as the slider 78 is moved to a setting closer to ground 49.

The timing control of the output pulse train 18 obtained by variation of the setting of potentiometer 70 will be understood by considering that the slider 74 thereof is moved to the right. The setting of slider 74 determines the voltage to which the potential of base 24 or 32 attempts to return as its respective transistor 20 or 28 goes from the OFF condition to the ON condition. When the base-emitter junction of the particular transistor 20 or 28 starts to conduct, its base potential ceases to rise, thereby determining the pulse width and the timing of the output pulse train. As the slider 74 has been illustratively moved to the right, the width of both the up level and down level of pulse train 18 has been reduced. The result is a decreased pulse width and increased pulse frequency thereof.

A second preferred embodiment 90 of this invention is presented in FIG. 2. It differs from the astable multivibrator 10 of FIG. 1 in that its control section 92 has been modified to provide both pulse width and output pulse train frequency control. This is accomplished by providing separate potentiometers 94 and 96 for the bases 24 and 32, respectively. Potentiometers 94 and 96 are connected via respective sliding contacts 98 and 100, to base resistors 102 and 104. The potentiometers 94 and 96 are connected by common terminal 106. Terminal 106 is connected to junction 60.

The operation of astable multivibrator 90 will now be considered. The pulse width of train 14 is the pulse frequency of train 18 and vice versa. Slider 98 varies the pulse width of train 14 and the frequency of train 18; slider 100 varies the pulse width of train 18 and the frequency of train 14. Accordingly, by appropriate settings of sliders 98 and 100, both the pulse width and frequency of either pulse train can be independently controlled. The desired pulse train is obtained through variation of the settings while the timing characteristics of an output pulse train can be determined by conventional experimental techniques.

FIG. 3 illustrates an embodiment 148 of this invention which provides both amplitude and timing modulation of an output pulse train therefrom. It includes a control section 150 in which there is provision for a variable voltage 152 as the transistor base biasing voltage and a variable voltage 154 for the voltage level at which terminal 60 is maintained. It is readily apparent that the amplitude and timing controls afforded by the embodiments of FIGS. 1 and 2 have been generalized. The resultant modulation of both amplitude and timing of the output pulse train permits the multivibrator 148 to be incorporated with external analog voltage producing circuitry of manifesting a wide variety of pulse patterns explicity related thereto. It is readily apparent that the generalized circuitry of FIG. 3 could also be patterned after the embodiment illustrated by FIG. 2 in that the potentiometers 94 and 96 could be replaced by a variable voltage supply.

Figures 5, 6:
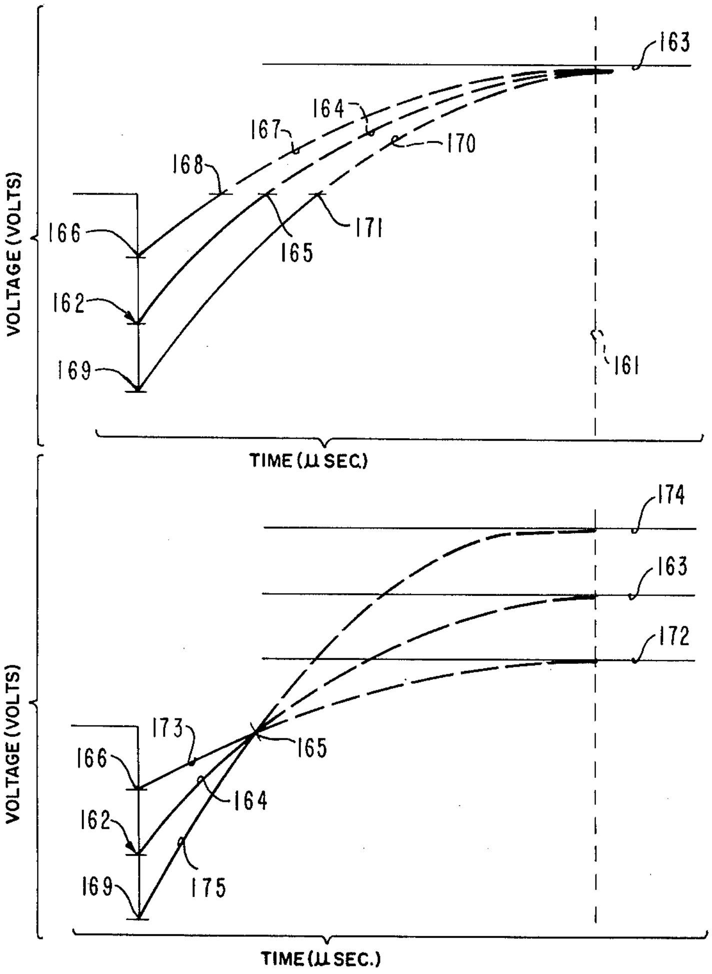
FIGURE 5 illustrates the source of timing variation when amplitude control is obtained in a conventional multivibrator.
FIGURE 6 illustrates the independence of timing control when amplitude control is obtained in an astable multivibrator in accordance with this invention.

The nature of the independence of the amplitude and timing controls for the pulse output train of astable multivibrators in accordance with this invention is illustrated by FIGS. 4 to 6. FIG. 4 shows the output pulse train 18 obtained at output terminal 16 of FIG. 1, which represents the collector 34 potential of transistor 28. Voltage curve 150 illustrates the base potential 32 during the output pulse train 18 cycle. Curve 160 bottoms at point 162.

FIG. 5 illustrates the nature of the change in timing which occurs when an output pulse amplitude change is obtained conventionally. Illustratively, the amplitude change can be obtained by varying the collector clamping potential, e.g., were cathode 58 of diode 54 connected to a voltage source of value between +V1 and ground 49, point 162 indicates the down-level of the base potential for an initial operation condition and potential level 163 represents the potential towards which the base rises on curve 164. Curve 164 intersects the zero voltage line at point 165. When the down-level is changed to point 166, potential level 163 does not change. However, the base rises towards potential level 163 on curve 167 which intersects the zero voltage line at point 168. If the down-level is increased to point 169, the base rises towards potential level 163 on curve 170 which intersects the zero voltage line at point 171. It is readily apparent that point 168 represents an increase in frequency and point 171 represents a decrease in frequency.

Vertical line 161 indiates the time which would be required for each rising curve to reach effectively the base return voltage level 163.

FIG. 6 illustrates the output train timing control provided by this invention which is substantially independent of the effect of the output pulse train amplitude control. With reference to FIG. 1, the voltage at junction 60 is directly related to the output pulse train amplitude. With point 162 being the initial down-level of the base 32, the voltage towards which the base 32 rises on curve 164 is voltage level 163. When the down-level is shifted to point 166 by varying the position of slider 80 the base 32 rises towards potential level 172 on curve 173. If the down-level is shifted to point 169, the base 32 rises toward potential level 174 on curve 175. The respective change in the potential level towards which the base 32 rises is proportional to the change in the down-level of base 24 voltage. The curves 164, 173 and 175 pass through point 165. Therefore, in an astable multivibrator in accordance with this invention, the timing of the output pulse train is substantially unaffected by the change in the amplitude thereof.

Vertical line 161 indicates the time which would be required for each rising curve 164, 173 and 175 to reach effectively the respective base return voltage level 163, 172 or 174.

The following illustrative embodiments of this invention have considerable utility: pulse train producing apparatus; pulse train signal coding apparatus; pulse train modulation apparatus; and controllable time base apparatus.

While the invention has been particularly shown and described with reference to preferred embodiments thereof, it will be understood by those skilled in the art that various changes in form and details may be made therein without departing from the spirit and scope of the invention.

What is claimed is:

1. Variable pulse train producing apparatus comprising: a pulse train output section and a pulse train characteristic control section therefor; said pulse train output section including first and second current conductable means with first and second settable conduction conditions therein, and current-in and current-out terminals therefor, said first and second current conductable means having first and second pulse output terminals and first and second current condition control means respectively, means for providing first and second direct potential level sources connected respectively to said current-in and said current-out terminals, first and second relaxation time network means having respective relaxation-times connected respectively between said first current-in terminal and said second control means and between said second current-in terminal and said first control means; said pulse characteristic control section including a pulse train amplitude characteristic control portion and a pulse train timing characteristic control portion; a first selectively adjustable voltage source; said amplitude control portion including an OR circuit connected to said current-in terminals establishing a common junction at a voltage level intermediate said first voltage level source and said second voltage level source, said common junction being connected to said second voltage level source via the first adjustable voltage source; said timing characteristic control portion including a second adjustable voltage source connected between said OR circuit common junction and said relaxation-time network means; whereby variation of the voltage across said first adjustable voltage source controls said pulse amplitude characteristic and variation of the voltage across said second adjustable voltage source controls said timing characteristic.

2. In pulse train producing apparatus comprising a pulse train output section and a pulse train characteristic control section therefor; said pulse train output section including first and second transistors having respective bases, collectors, and emitters with first and second pulse output terminals connected to said respective collectors, means to provide first and second direct voltage level sources connected to said collectors and said emitters respectively, first and second capacitor-resistor networks having respective relaxation-times connected respectively between said first collector and said second base and between said second collector and said first base; said pulse characteristic control section including a pulse train amplitude characteristic control portion and a pulse train timing characteristic control portion; said amplitude control portion including first and second unilateral impedances connected to said respective collectors to form an OR circuit having a common junction, said OR circuit being poled to establish said common junction at a voltage level intermediate said first voltage level source and said second voltage level source, the improvement comprising: a first resistance potentiometer with slider terminal, said first potentiometer being connected between said OR circuit common junction and said second voltage level source, said slider terminal being connected to said common junction; said timing characteristic control portion including a second potentiometer with second slider terminal connected betwen said OR circuit common junction and said second voltage level source, said second slider terminal being connected to said resistors of said capacitor-resistor networks; whereby variation in the setting of said first potentiometer slider controls said pulse train amplitude and variation in the setting of said second potentiometer slider controls the timing characteristics of said output pulse train.

3. Pulse train producing astable multivibrator having first and second transistors with respective bases, first and second resistors connected to said bases, first and second resistance potentiometers with first and second sliding contacts connected to the other ends of said respective resistors, first and second diodes connected to said collectors and a diode common junction to establish said junction at a potential determined by the dynamic potentials of said collectors, said first and second resistance potentiometers being connected together at a common potentiometer terminal and to ground at their other terminal, said common potentiometer terminal being connected to said common junction, a third resistance potentiometer with third sliding contact, one end of said third potentiometer being connected to said diode common junction and the other end thereof being connected to ground, said third sliding contact being connected to said diode common junction, whereby said pulse train at the collector terminals is individually controlled as to pulse width and frequency by said first and second potentiometers and is controlled as to amplitude by said third potentiometer.

4. Pulse train producing astable multivibrator having first and second transistors with respective collectors, bases and emitters, a bias voltage source for said transistors, first and second diodes connected between said respective collectors and a diode common junction and poled to establish said junction at potential level relative to said voltage source, a first periodically variable voltage source connected between said diode common junction and ground and a second periodically variable voltage source connected between said diode common junction and said bases whereby said first variable voltage varies the amplitude of said pulse train and said second variable voltage varies the timing of said pulse train.

References Cited by the Examiner

UNITED STATES PATENTS

| | | | |
|---|---|---|---|
| 2,750,502 | 6/56 | Gray | 332—14 |
| 2,787,712 | 4/57 | Priebe et al. | 331—113 |
| 2,900,606 | 8/59 | Faulkner | 331—113 |
| 3,013,162 | 12/61 | Antista | 332—31 |
| 3,013,220 | 12/61 | Norris | 332—14 |

ROY LAKE, *Primary Examiner.*

ROBERT H. ROSE, *Examiner.*